(12) United States Patent
Pellon

(10) Patent No.: US 8,294,524 B2
(45) Date of Patent: Oct. 23, 2012

(54) TRANSVERSAL AGILE LOCAL OSCILLATOR SYNTHESIZER

(75) Inventor: Leopold E. Pellon, Hainesport, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 358 days.

(21) Appl. No.: 12/645,475

(22) Filed: Dec. 22, 2009

(65) Prior Publication Data

US 2010/0156472 A1 Jun. 24, 2010

Related U.S. Application Data

(60) Provisional application No. 61/139,771, filed on Dec. 22, 2008.

(51) Int. Cl.
*H03B 9/14* (2006.01)

(52) U.S. Cl. ............. 331/56; 331/46; 341/143; 341/144

(58) Field of Classification Search ................ 331/46, 331/56; 341/143, 144
See application file for complete search history.

(56) References Cited

U.S. PATENT DOCUMENTS

| 5,323,157 A * | 6/1994 | Ledzius et al. ................ 341/143 |
| 5,590,155 A * | 12/1996 | Yasuda ......................... 375/261 |
| 7,504,976 B1 | 3/2009 | Pellon |

OTHER PUBLICATIONS

U.S. Appl. No. 12/645,474, filed Dec. 22, 2009 in the name of Pellon, Leopold E.

* cited by examiner

*Primary Examiner* — Joseph Chang
*Assistant Examiner* — Jeffrey Shin
(74) *Attorney, Agent, or Firm* — Howard IP Law Group, PC

(57) ABSTRACT

A representative integrated circuit comprises a clock signal generator that generates a clock signal, a code pattern generator that generates digital pattern data based on the clock signal, and a transversal digital-to-analog conversion (T-DAC) unit that includes a plurality of registers and a unary modulator (Umod) array. The T-DAC unit provides frequency selection ranges covering wide operational bands based on the digital pattern data and the clock signal.

20 Claims, 17 Drawing Sheets

TRANSVERSAL AGILE LOCAL OSCILLATOR SYNTHESIZER

CROSS-REFERENCE TO RELATED APPLICATIONS

This application claims the benefit of U.S. provisional patent application Ser. No. 61/139,771 filed Dec. 22, 2008, the entirety of which application is expressly incorporated by reference herein.

TECHNICAL FIELD

The present disclosure relates to radio frequency signals. More particular, the present disclosure relates to waveform generators.

BACKGROUND

Superheterodyne and direct conversion receivers and waveform generators (also known as exciters) are employed in a wide range of applications. These include (but are not limited to) radar and communications transceivers. These receivers provide the ability to select a narrower RF band within a wider operational band for signal reception and transmission using detection and modulation circuits implemented at narrower intermediate frequencies bands, which are typically lower than the transmit band frequencies, and include baseband. The narrower or lower center frequency intermediate frequency bands are better suited to detection and modulation where analog-to-digital converter (ADC), and digital-to-analog converter (DAC) performance is improved and more commonly available. The frequency conversion is accomplished through at least one or more stage of mixing for up-conversion and/or down-conversion. An ability needed for these receivers and exciters is for frequency selectivity and/or hopping to provide frequency agility within the operational band. Agility relates to both the number of frequencies covering tuning over an operational band and also relates to the speed of tuning. The local oscillator synthesizers employed produce the reference signals at an offset from the radio frequency of interest, where the offsets are related to the intermediate frequencies. The synthesizer typically adjusts its frequency to address the agility of the receiver, but also generates phase noise and spurious signals which degrade the performance of the receiver and exciter.

To address suppression of clutter in radar, and generally the suppression of interference and jamming in transceivers, the receiver dynamic range and/or the waveform generator's spectral purity have certain requirements. With advancing threats and denser RF environments, the ability of prior art frequency agile synthesizers are limited by phase noise and spurious produced and are also more complex than desired. In particular higher performance low phase noise agile local oscillator (LO) synthesis results in configurations with significant increases in overall complexity, size weight and power consumption.

The phase noise and spectral purity of LO synthesizers are derived by employing low phase noise fixed frequency oscillators employing high quality factor resonators for which all synthesized frequencies are synchronized to in order to meet particular frequency accuracy, drift and phase coherence requirements. Agile high performance synthesizers typically degrade phase noise by 20 dB to 40 dB over the best available fixed frequency oscillators for typical levels of agility desired.

The traditional high performance low phase noise LO synthesis employs direct RF synthesis techniques known within the prior art, and includes low phase noise frequency division, mixing, and switched filtering to develop an ultra low noise frequency agile LO generated by combining a smaller number of frequencies in stages. This approach, however, has phase noise limitations due to the addition of multiple components serially within the chain, which add residual phase noise to the output signal. In practice receivers and waveform generators having wide operational bands and many center frequencies required are limited in phase noise performance by the synthesizer by a significant margin over the best oscillators.

Additionally multiple bandpass filters are utilized to reject mixer and harmonic spurious, where settling time in switching filters, and related complexity of multiple filters, switches and loss recovery amplifiers increases size, weight and power consumptions while further limiting phase noise.

Frequency synthesis techniques, such as those that use phase locked loop (PLL) employ frequency fractional division devices within the PLL feedback loop for frequency agile synthesis and are subject to both settling time limitations, and spurious and noise generated in the fractional dividers, which are subsequently amplified at the output.

Direct digital synthesis (DDS) employing digital-to-analog (DAC) devices, have lower than desired linearity performances resulting in generation of unwanted spurious signals due to amplitude and time skew mismatch distortion effects and due to phase accumulator phase quantization resulting in a large number of spurious signals.

Recently, there has been focus brought to architectures and technologies that combine a plurality of LO synthesizer units to yield an improvement of phase noise relative to a single unit. While this approach can reduce uncorrelated noise terms it does not address harmonic or other correlated terms. A simplistic approach results in cost, size and weight of a plurality of traditional high performance LO synthesizers can be prohibitive. Other approaches employing miniaturized tunable oscillators arrays on integrated circuits with frequency injection locking address the size weight and power and complexity of parallel architectures, but performance of the individual synthesizers are limited in phase noise and agility.

Accordingly, an improved frequency LO synthesizer is desirable in the art that provides improved spectral purity, improved frequency agility, in addition to size weight and power advantages.

SUMMARY

A representative integrated circuit and method of operation comprises a clock signal generator that generates a clock signal, a code pattern generator that generates digital pattern data based on the clock signal, and a transversal digital-to-analog conversion (T-DAC) unit that includes a plurality of registers a unary modulator (Umod) array, a plurality of amplitude and sign adjustable digital to analog converters, and a comber of the output signals. Each of the amplitude and sign values represents a coefficient and is independently programmed. The Umod array provide modulation common to the plurality of signals. The T-DAC unit is thus operated as a comb filtering digital to analog converter that provides frequency selection ranges covering wide operational bands based on the digital pattern data, comb filter coefficients and the clock signal.

Addition of a memory control elements within an integrated circuit implements that configures the T-DAC can provide many combinations and a wide range of possible frequencies in order to simplify operation. Additionally, the phase noise produced by the T-DAC device is superior as a result of noncoherent parallel combining of noise sources.

Other systems, devices, methods, features of the disclosure will be or will become apparent to one skilled in the art upon examination of the following figures and detailed description. It is intended that all such systems, devices, methods, features be included within the scope of the invention, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, the reference numerals designate corresponding parts throughout the several views. While several embodiments are described in connection with these drawings, there is no intent to limit the disclosure to the embodiment or embodiments disclosed herein. On the contrary, the intent is to cover all alternatives, modifications, and equivalents.

DETAILED DESCRIPTION

Exemplary synthesizers are discussed with reference to the figures. Although these systems are described in detail, they are provided for purposes of illustration only and various modifications are feasible. In general, the exemplary synthesizers address the field of local oscillator synthesis in which improvements to phase noise, and spectral purity are desired, while also providing the frequency selection ranges covering wide operational bands.

In general, the disclosed integrated circuit and method for operation generates a frequency selectable local oscillator reference signal using a digital to analog converting comb filter. The comb filter comprises a transversal digital-to-analog converter (TDAC) unit which is comprised of a plurality of amplitude and sign adjustable low resolution digital to analog and clock modulating converters which receive digital signals from a plurality of taps from a digital shift register. The plurality of digital to analog and clock modulating converter outputs are combined on a traveling wave transmission line for generating the output local oscillator signal. Additionally the method of the disclosure combines this with a circular pattern generator and method of programming to implement a discrete form of the SINC filter where the main lobe corresponds to the desired frequency and the zeros correspond to the spurious frequencies.

Clock signal generators that amplify or convert an external sampling clock signal into a common digital shift register clock signal with clock frequency fs, and a common unary modulation clock signal, which is selected as a multiple of fs/2, a circular code pattern generator that generates digital patterns that repeat within an adjustable number of cycles Ncycle, where the maximum cycle length corresponds to the number of available shift register taps, and said circular pattern is derived from a quantized sine wave. Such a pattern produces a dominant desired term and Ncycle−1 undesired secondary spurious terms. The apparatus is programmed with amplitude and sign weights to produce the effect of a comb filter centered to pass the desired term and null each of the spurious terms. This produces the desired sine wave local oscillator reference signal, ideally without spurious terms since all spurious terms reside at filter comb filter nulls. The absence of spurious at frequencies other than the comb filter nulls results in improved digital to analog conversion direct synthesis of local oscillator signals. Also, plurality of digital to analog converters lead to reduction of uncorrelated residual phase noise produced in each, thereby providing improved phase noise.

Figure 1:
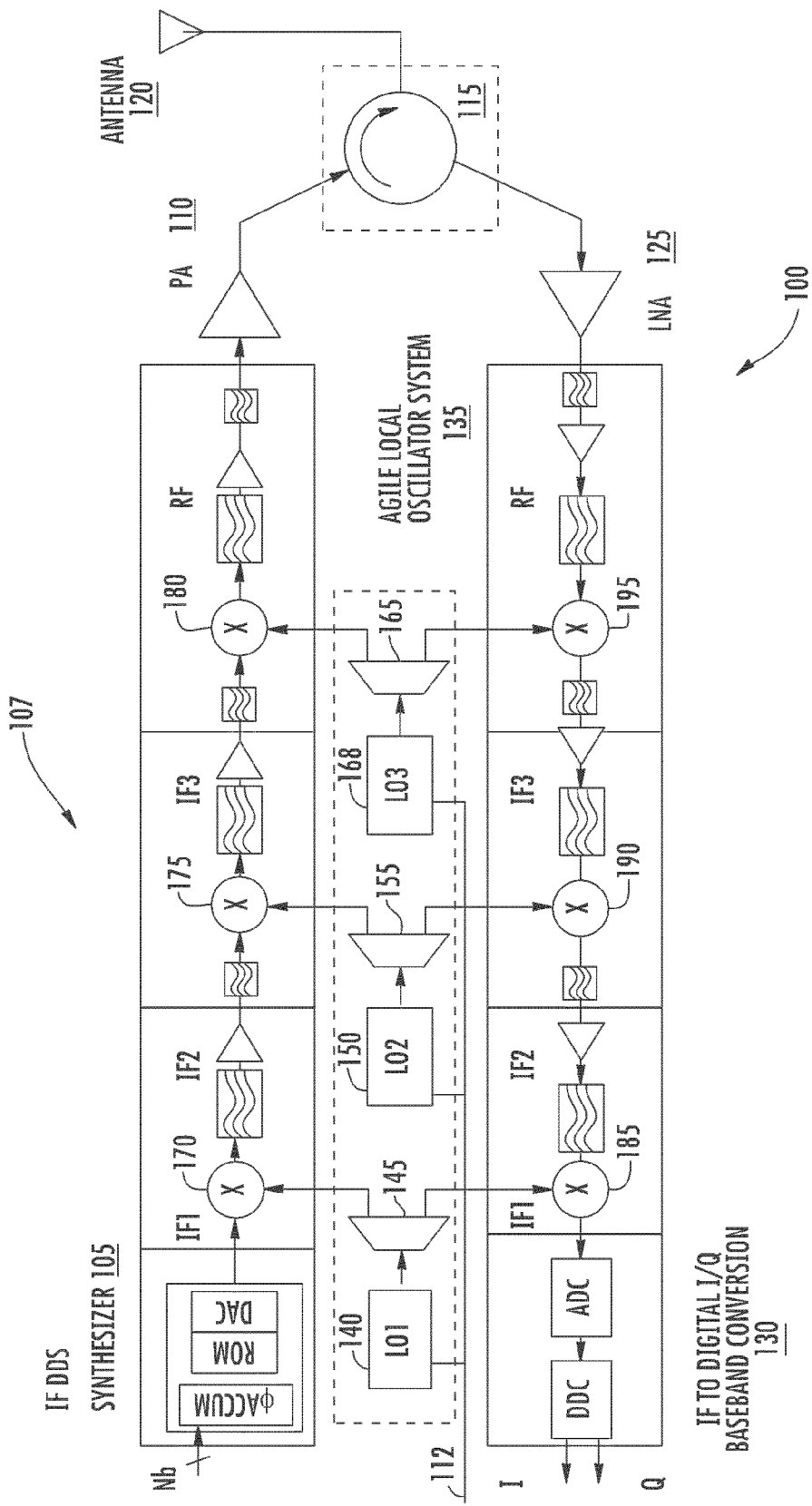
FIG. 1 is a block diagram that illustrates a low frequency transceiver system having an agile local oscillator system in accordance with an embodiment of the disclosure.

Integrated circuit implementation can further include all the pattern and weight coefficients stored on chip within memory to form a complete synthesizer requiring only the external clock, a frequency control word. Each frequency word will look-up a unique digital pattern and comb filter. It may also select multiplication of the unary clock for translating the comb filter by multiples of one half the clock frequency. This represents a substantial reduction over prior art in complexity for agile LO synthesis. Implementation of the integrated circuit using high speed transistor technologies, such as SiGe/CMOS (Silicon Germanium/Complementary Metal Oxide Semiconductor) can result in a self contained multioctave local oscillator generator integrated circuit over DC to 20 GHz range replacing prior art which is conventionally the size of an rack mounted assembly Referring to FIG. 1 is a block diagram that illustrates a 3 stage superheterodyne multiple stage transceiver system 100, including a transmitter and a receiver having an agile local oscillator system 135 in accordance with an embodiment of the disclosure. The three stage superheterodyne transceiver system 100 includes a transmitter 107 and a receiver 118. The exemplary system includes both transmitter and receiver, but each can be employed separately as well.

A transmitter waveform generator employs direct digital synthesizer (DDS) 105 for generating a low intermediate frequency modulated signal that is coupled to an up-converter composed of three radio frequency (RF) sections that include mixers 170, 175, 180 filters that are employed to select desired mixer terms, and amplifiers that amplify the selected terms to overcome losses from the mixing operation. The output of the chain produces a higher frequency low power signal that is amplified by a power amplifier 110 which receives signals from the waveform generator and produces amplified signals. The amplified signals are received by an antenna circulator 115 which sends the amplified signals to an antenna 120 for transmission.

Also within the transceiver system 100 can also includes a receiver 118 for amplifying and converting receive RF signals via an antenna 120. The received RF signals are passed through the antenna circulator 115 to a low noise amplifier 125, which amplifies the received signals. The amplified received signals are passed through down-converter composed of another three RF sections having mixers 195, 190, 185. Similar to the transmitter 107, filters and amplifiers in the receiver 118 are employed to select mixer terms and to overcome losses. At the output of the chain, a lower intermediate frequency replica of the radio frequency signals is produced for conversion by IF to digital I/Q baseband conversion unit 130 composed of an analog-to-digital converter for converting analog signals to digitized samples, and a baseband converter for producing digitized Inphase and Quadrature (I and Q) components of the digitized bandpass signal.

The three stage superheterodyne receiver system 100 further includes a first local oscillator 140, a second local oscillator 150 and third local oscillator 168, all of which can include a transversal agile local oscillator synthesizer. The oscillators 140, 150, 168 are coupled to power dividers 145, 155, 165, respectively. The power dividers 145, 155, 165 are coupled to mixers 170, 185, 175, 190, 180,195, respectively. The transversal agile local oscillator synthesizer 160 (FIG. 1c) is capable of frequency agile generation of local oscillator signals with low phase noise covering a wide instantaneous RF band and is further described in FIGS. 2-9.

Figure 1A:
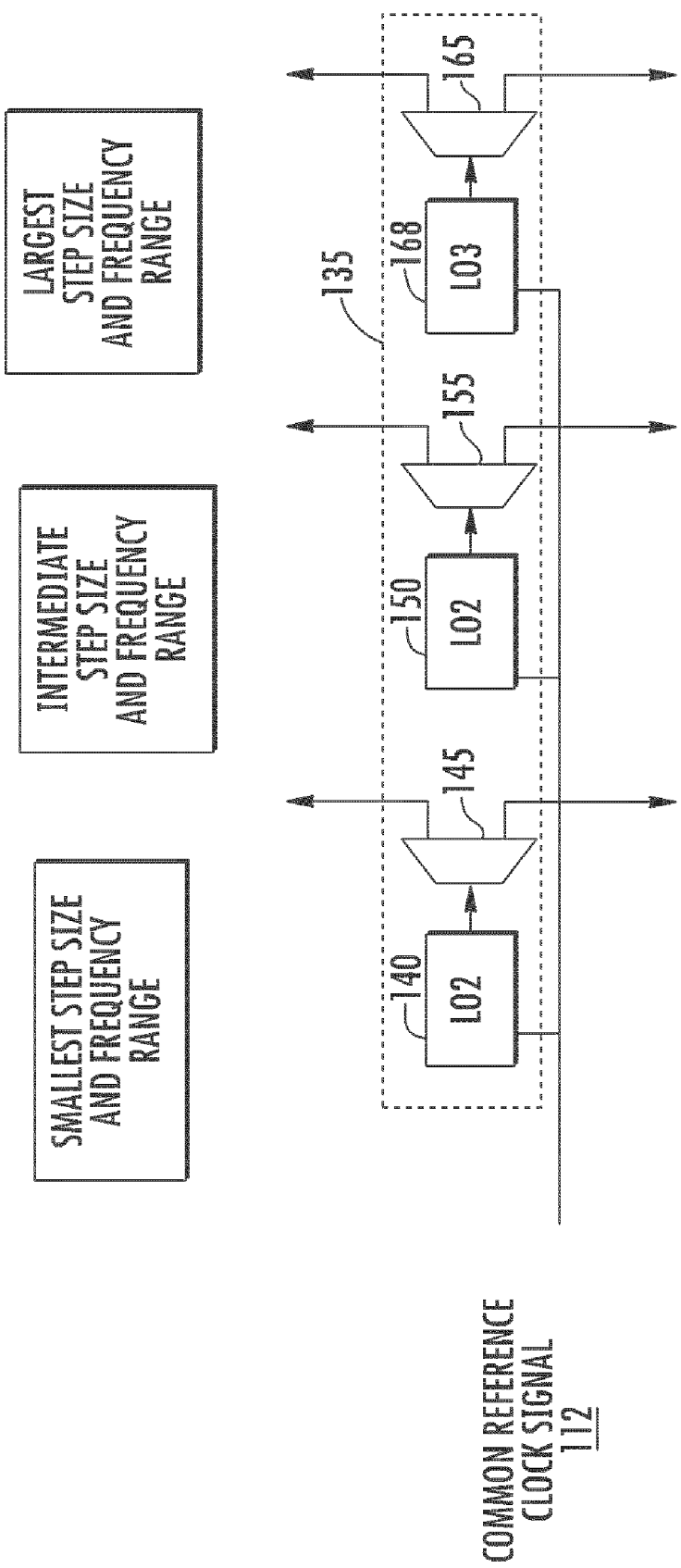
FIG. 1a is a functional diagram of local oscillators in accordance with an embodiment of the disclosure.

FIG. 1a is a functional diagram of local oscillators 140, 150, 168, such as that shown in FIG. 1. The local oscillators 140A, 150A, 168A receives a common reference clock signal 112 and can produce various step sizes and frequency ranges based on the common reference clock signal 112. In this example, the first local oscillator 140A produces a smallest step size and smallest frequency range out of the three local oscillators 140A, 150A, 168A. The second and third local oscillators 150A, 168A produce intermediate and largest step sizes and frequency ranges, respectively. It should be noted that the transversal agile local oscillator synthesizers can be used to implement the local oscillators 140A, 150A, 168A.

Figure 1B:
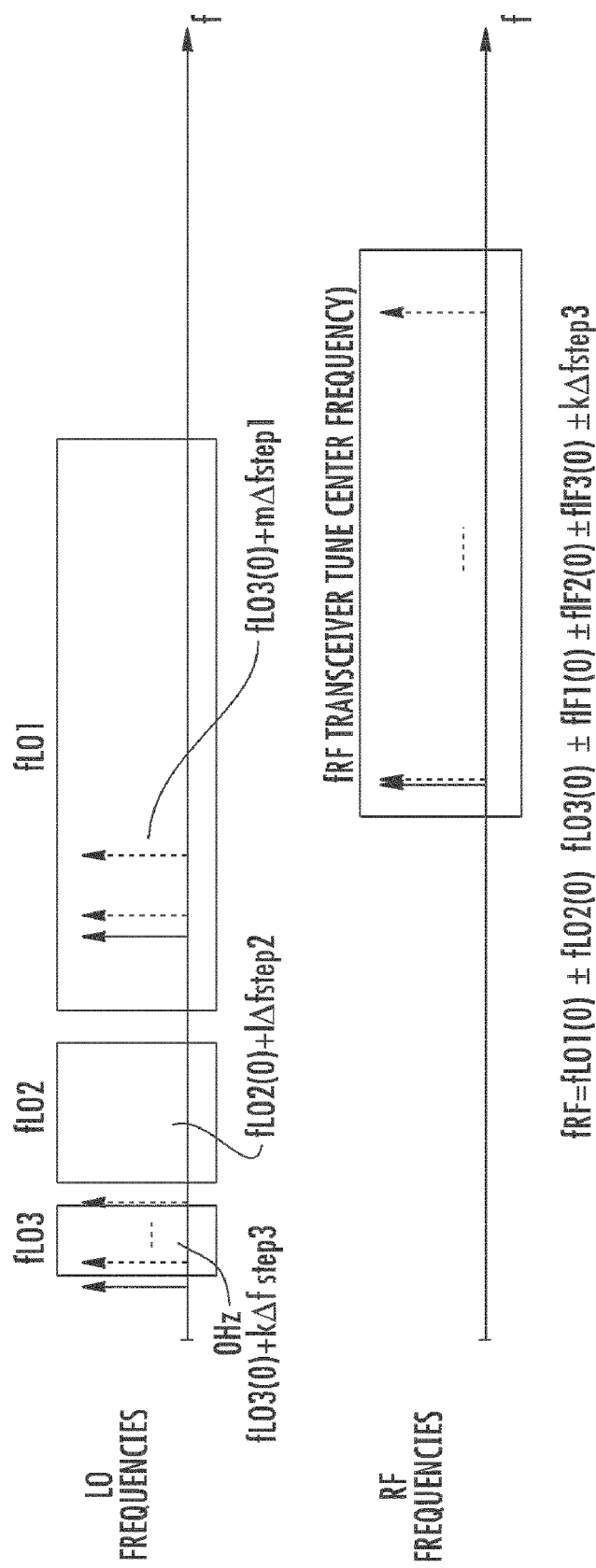
FIG. 1b shows various step sizes and frequency ranges that can be produced by local oscillators in accordance with an embodiment of the disclosure.

The various step sizes and frequency ranges from the local oscillators 140A, 150A, 168A are shown on a frequency line in FIG. 1b.

Figure 1C:
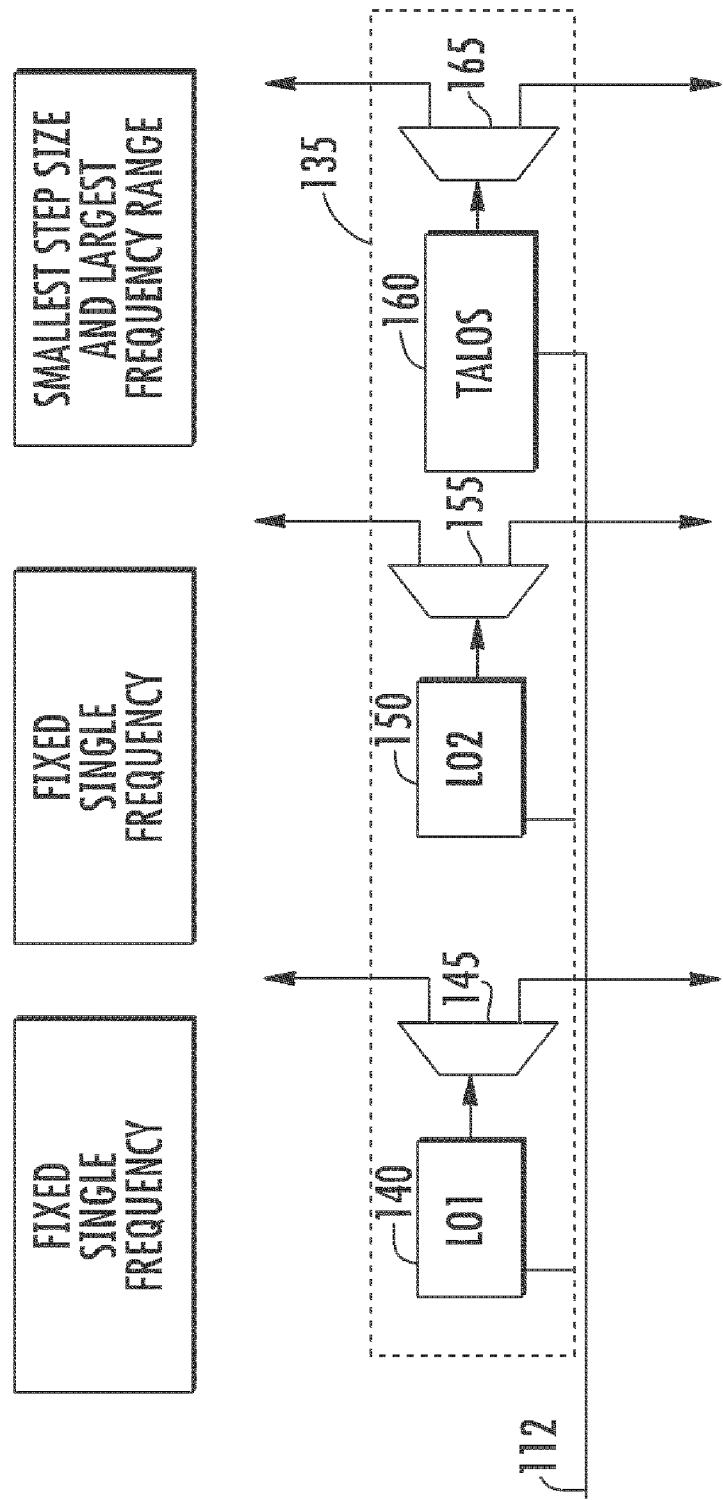
FIG. 1c is a functional diagram of local oscillators and a transversal agile local oscillator synthesizer in accordance with an embodiment of the disclosure.
Figure 1D:
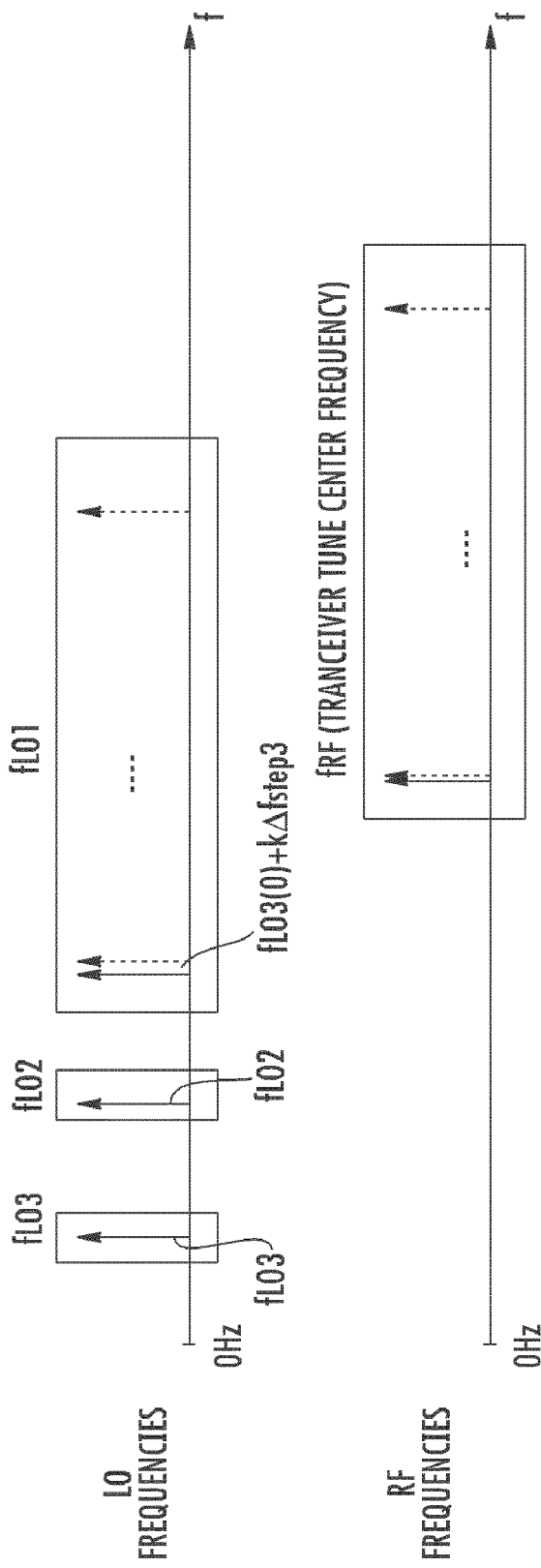
FIG. 1d shows various step sizes and frequency ranges that can be produced by local oscillators and a transversal agile local oscillator synthesizer in accordance with an embodiment of the disclosure.
Figure 2:
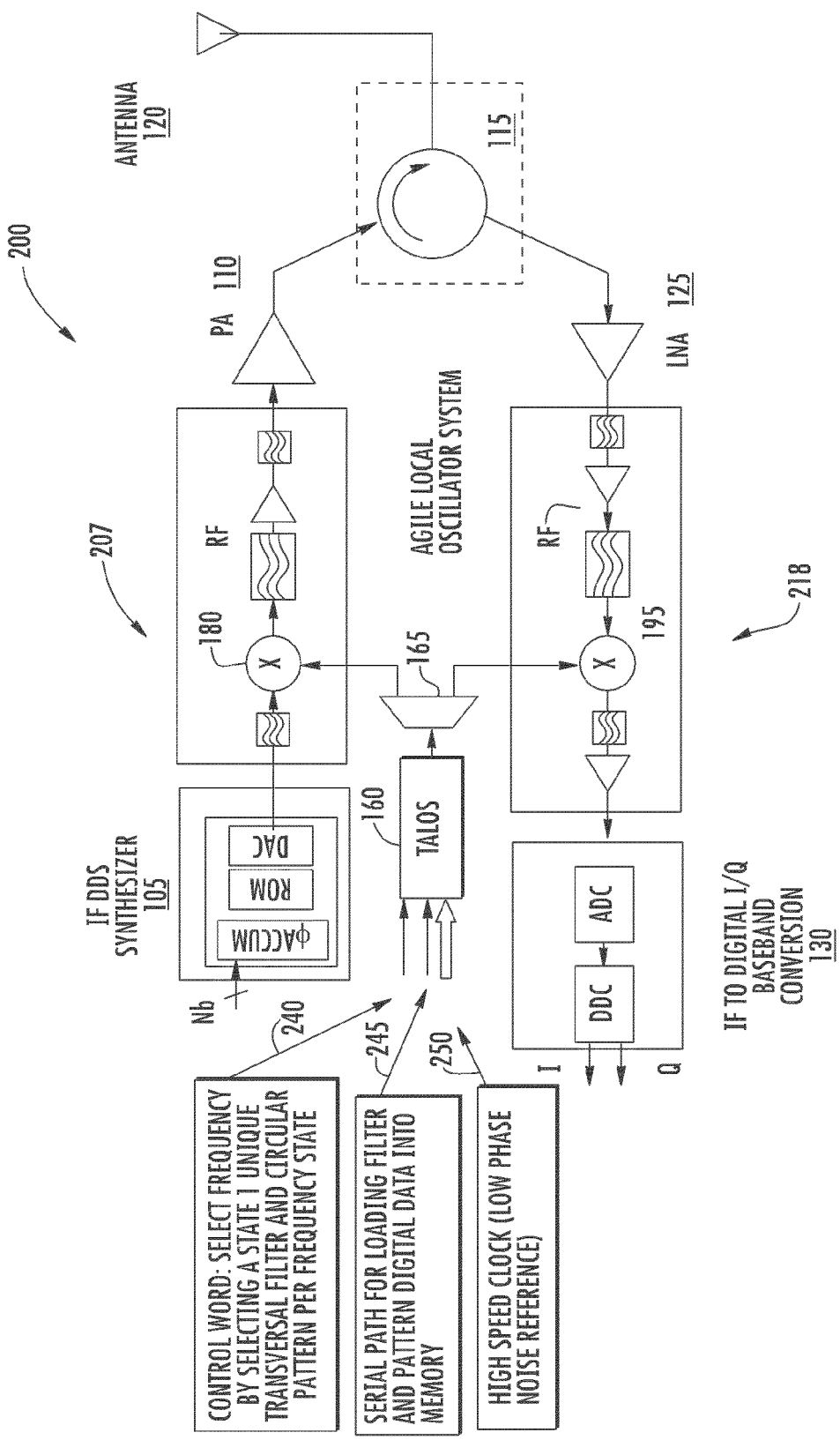
FIG. 2 is a block diagram that illustrates a high frequency transceiver system having a transversal agile local oscillator synthesizer in accordance with an embodiment of the disclosure.

FIG. 1c is a functional diagram of local oscillators 140C, 150C and a transversal agile local oscillator synthesizer 160, such as that shown in FIG. 1. In this example, local oscillators 140C, 150C produce fixed single frequencies and the transversal agile local oscillator synthesizer 160 produces a smallest step size and largest frequency range. The various step sizes and frequency ranges from the local oscillators 140C, 150C and a transversal agile local oscillator synthesizer 160 are shown on a frequency line in FIG. 1d FIG. 2 is a block diagram that illustrates a transversal agile local oscillator synthesizer 160 used in another system—a single stage superheterodyne transceiver system 200 that includes a transmitter 207 and receiver 218. A single stage up-converter within the transmitter 207 and a single stage down-converter within the receiver 218 is more capable of maintaining low noise and low distortion due to the simplification of the chain. The system 200 has a similar architecture as the system 100 in FIG. 1 and thus, like features are labeled with the same reference numbers, such as the IF DDS 105, power amplifier 110, circulator 115, antenna 120, low noise amplifier 125, IF to digital I/Q baseband conversion unit 130 that includes an analog-to-digital converter for converting analog signals to digitized samples, and a baseband converter for producing digitized Inphase and Quadrature (I and Q) components of the digitized bandpass signal.

The transversal agile local oscillator synthesizer 160 generates local oscillator signal to the power divider 165, and mixers 180, 195. The inputs to the transversal agile local oscillator synthesizer 160 includes a frequency control word 240, a serial 245 or other port for programming on chip memory for storing circular quantized sinewave patterns and for storing comb filter coefficients, and a low phase noise fixed reference clock 250.

The data provide through port 245 includes data associated with a serial path for loading filter and pattern digital data that facilitates synchronizing and triggering the transversal agile local oscillator synthesizer 160. The control word 240 is used by the transversal agile local oscillator synthesizer 160 to select a specific code pattern and associated weighting from memory, e.g., random-access memory (RAM) and read-only memory (ROM). The reference clock 250 is generally a low phase noise stable reference sinewave signal, produced by a fixed frequency source have low phase noise.

The transversal agile local oscillator synthesizer 160 provides continuous wave mixer reference signals with frequency selection coverage over the transmit and receive bands, stepped in frequency increments sufficiently small to enable overlapped coverage by the transceiver 200 of select bands. Common step size of interest range from 10 MHz to 100 MHz and commonly several hundred frequencies can be generated by a single transversal agile local oscillator synthesizer 160. It should be appreciated by a person skilled in the art that use of higher intermediate frequency capable direct digital synthesizer (DDS) and analog to digital converter (ADC) elements within the system of FIG. 2 and can allow improved modulation bandwidth and spurious free dynamic range.

The transversal agile local oscillator synthesizer 160 can be used to produce a wide range of local oscillator signals with a wide frequency range of frequencies in uniform steps, thereby enabling the transceiver 200 to have a wide operational band supporting multiple applications, including frequency hopping systems. The ability to select local oscillator signals can be contained within a single integrated circuit due to the method of the invention, which is amenable to low residual phase noise and spurious signals, without requiring additional components, such as mixers, and filters. Therefore, with appropriate design, transceiver 200 of FIG. 2 can exhibit wider bandwidths and employs fewer components within its local oscillator synthesizer, which can reside within an integrated circuit. Given that spurious signals are limited to a comb of possible frequencies, the transversal agile local oscillator synthesizer 160 is also amenable to high dynamic range receivers and waveform generator frequency plan where residual spurious terms given nonideal suppression within the invention can be avoided, or out of the pass band.

Figure 3:
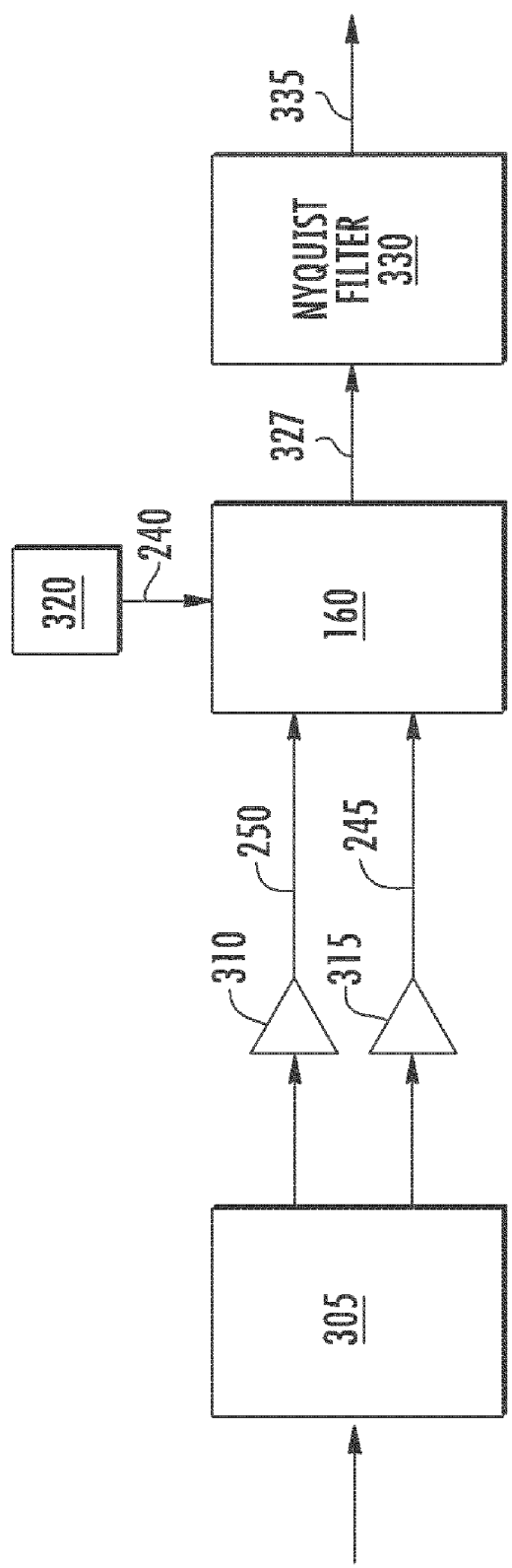
FIG. 3 is a high-level block diagram that illustrates a local oscillator subsystem in accordance with an embodiment of the disclosure.

FIG. 3 is a high-level block diagram that illustrates a local oscillator subsystem 300 in accordance with an embodiment of the disclosure. A signal generator unit 305 is coupled the transversal agile local oscillator synthesizer 160. The signal generator unit 305 includes a clock generator and unary modulator (Umod) that generates reference clock 250 and Umod data 245. A pattern unit 320 provides the control word 240 to the transversal agile local oscillator synthesizer 160, which selects a frequency that the synthesizer 160 generates. The transversal agile local oscillator synthesizer 160 sends the generated frequency to, for example, a Nyquist filter 330. Table 1 is shown below providing exemplary data where the transversal agile local oscillator synthesizer 160 is provided with one set of clocks.

TABLE 1

| | | |
|---|---|---|
| Clock frequency (fs = fd) | 4 GHz | 2.7 GHz |
| Number of umod (Numod, M) | 2 | 3 |
| frequency of umod (fumod = Mfs) | 4 GHz | 4.05 GHz |
| Number of pattern (Npat) | 400 | 270 |
| Number of total frequency (Nfreq_tot) | 201 | 136 |
| Number of frequency (Nfreq) | 200 | 135 |
| fstep/fs | 10 MHz | 10 MHz |
| f (nfreq = 0)/fs | 4.000 GHz | 2.700 GHz |
| f (nfreq = 1)/fs | 3.990 GHz | 2.710 GHz |
| f (nfreq = Nfreq) | 2.000 GHz | 4.050 GHz |

Based on the data in Table 1, the transversal agile local oscillator synthesizer 160 can produce RF signals ranging from 2.00 GHz to 4.050 GHz with 10 MHz steps.

Table 2 is shown below providing exemplary data where the transversal agile local oscillator synthesizer 160 is provided with multiple sets of input clocks and more specifically where a common data clock fs of 1.4 GHz is used in conjunction with 5 umod frequencies derived by frequency multiplication of the 1.4 GHz clocks signal. Also a switched bank of Nyquist band anti-aliasing filters (nominally five) is provide where each filter is centered to pass desired range.

TABLE 2

| | | | | | |
|---|---|---|---|---|---|
| fs | 1.4 GHz | 1.4 GHz | 1.4 GHz | 1.4 GHz | 1.4 GHz |
| Numod | 4 | 5 | 6 | 7 | 8 |
| fumod | 2.8 GHz | 3.5 GHz | 4.2 GHz | 4.9 GHz | 5.6 GHz |
| Npat | 140 | 140 | 140 | 140 | 140 |
| Nfreq_tot | 71 | 71 | 71 | 71 | 71 |
| Nfreq | 70 | 70 | 70 | 70 | 70 |
| fstep/fs | 10 MHz | 10 MHz | 10 MHz | 10 MHz | 10 MHz |
| f(nfreq = 0)/fs | 2.800 GHz | 2.800 GHz | 4.200 GHz | 4.200 GHz | 5.600 GHz |
| f(nfreq = 1)/fs | 2.790 GHz | 2.810 GHz | 4.190 GHz | 4.210 GHz | 5.590 GHz |
| f(nfreq = Nfreq) | 2.100 GHz | 3.500 GHz | 3.500 GHz | 4.900 GHz | 4.900 GHz |

Based on the data in Table 2, the transversal agile local oscillator synthesizer 160 can produce RF signals ranging from 2.1 GHz to 5.6 GHz with 10 MHz steps.

The transversal agile local oscillator synthesizer 160 improves phase noise performance over conventional synthesizers due to the method employing a common low noise source for the data clock fs and U-mod clock fumod through amplification, splitting and frequency multiplication, and short chain elements. The common low noise source includes a common dual clock source and driver 305 that outputs clock signals to the array of digital-to-analog converter (DAC) cells on lines 250 and 245 and the short chain elements include a DAC cell array. A shift register is employed to produce an array of delayed replica signals which are weighted by the DAC cells taps to implement a finite impulse response transverse comb filter for selecting the desired frequency. The combining of DAC signals results in coherent addition of the desired signals terms out of each DAC, and also noncoherent addition of the uncorrelated residual phase noise terms produced within each DAC cell This renders the noise of the array of DAC cells much smaller than the dual clock source 305. A reduction of 10 log 10(Ntap) in a single sideband phase noise of each cell (in units of dBc/Hz) is thus realized, where the number of taps or DAC cells is Ntap. For a 200 tap array a 23 dB reduction in phase noise can be realized.

The primary limiting source within the transversal agile local oscillator synthesizer 160 is potentially the distribution buffer drivers for the data clock and umod clock. An integrated circuit implementation employing SiGe Heterojunction Bipolar Transistor (HBT) transistors is capable of provide low residual phase noise inherent to the known characteristics of this technology.

Thus 310, 315 can be combined with the distributed transversal architecture to enable extremely low expected phase noise from the design because the HBT transistor. A design for a 25 ohm output impedance for 310, 315 results in a low residual phase noise with high slew rates. A simulation of outstanding SiGe clock buffer phase noise has shown a single sideband phase noise floor better than −170 dBc/Hz being reached within 10 KHz of the carrier.

Frequency multiplication and/or frequency division functions can be implemented in the HBT process to ease system implementation. An example of this amenable to integrated circuit techniques is to employ high speed HBT differential flip flops, designed to operate at clock rates as high as 40 GHz within this technology as the building blocks of a counter digital frequency divider, configured for division factors typically on the order of 1 through 8 within 305. These can be the same flip flops employed in forming the high speed circular shift register. Additionally phased lock loops using a wideband voltage controlled oscillator, feedback path with frequency divider and phase detector can provide frequency multiplication. These functions within 305 enable a useful range of choices for producing the data clock signal and umod clock signals with frequencies supporting multiple combinations, or modes of synthesis which increase the number of frequencies produced.

For example, a 10.24 GHz input could be frequency divided to provide a 5.12 GHz Umod clock and then further divided to provide a 1.28 GHz clock for the ternary data patterns. Conversely, if the system phase noise floor was less of a concern, a lower frequency input reference could be frequency multiplied within the transversal agile local oscillator synthesizer 160 to provide the Umod and ternary clock functions.

The transversal agile local oscillator concept, which employs a synchronized digital shift register pattern generator, also incorporates a synchronization function that enables the synthesizer 160 to control the timing and initial phase state of the local oscillator signal. The local oscillator signal can include a sinusoide with a phase ramp, representing the initial phase as an intercept at the initial time step, or first sample, and a phase increment at each successive sample representing the ramp, which may include a saw tooth phase function modulus +/−180 deg. This phase ramp is implicit to the signal and is not directly generated, as is done in conventional direct digital synthesis, but rather through means of control of the pattern, pattern initialization, and TDAC weights. The initial phase can be reset to any of the possible initial phases by means of selecting a delay shift in the circular digital pattern, or by modifying the TDAC weights. In a manner similar to direct digital synthesizers, the pattern can be initialized with a synchronization/reset pulse. This can be added as a feature to the design, such as frequency hopping applications.

Conversely, a preferred embodiment for this sends a synchronization pulse that resets a counter within the transversal agile local oscillator synthesizer 160. This counter can be used to gate a waveform start trigger sent on lower frequency timing boundaries corresponding to the synchronization pulse. It will be appreciated by persons skilled in the art that this type of function can be implemented using the standard design libraries.

Figure 4:
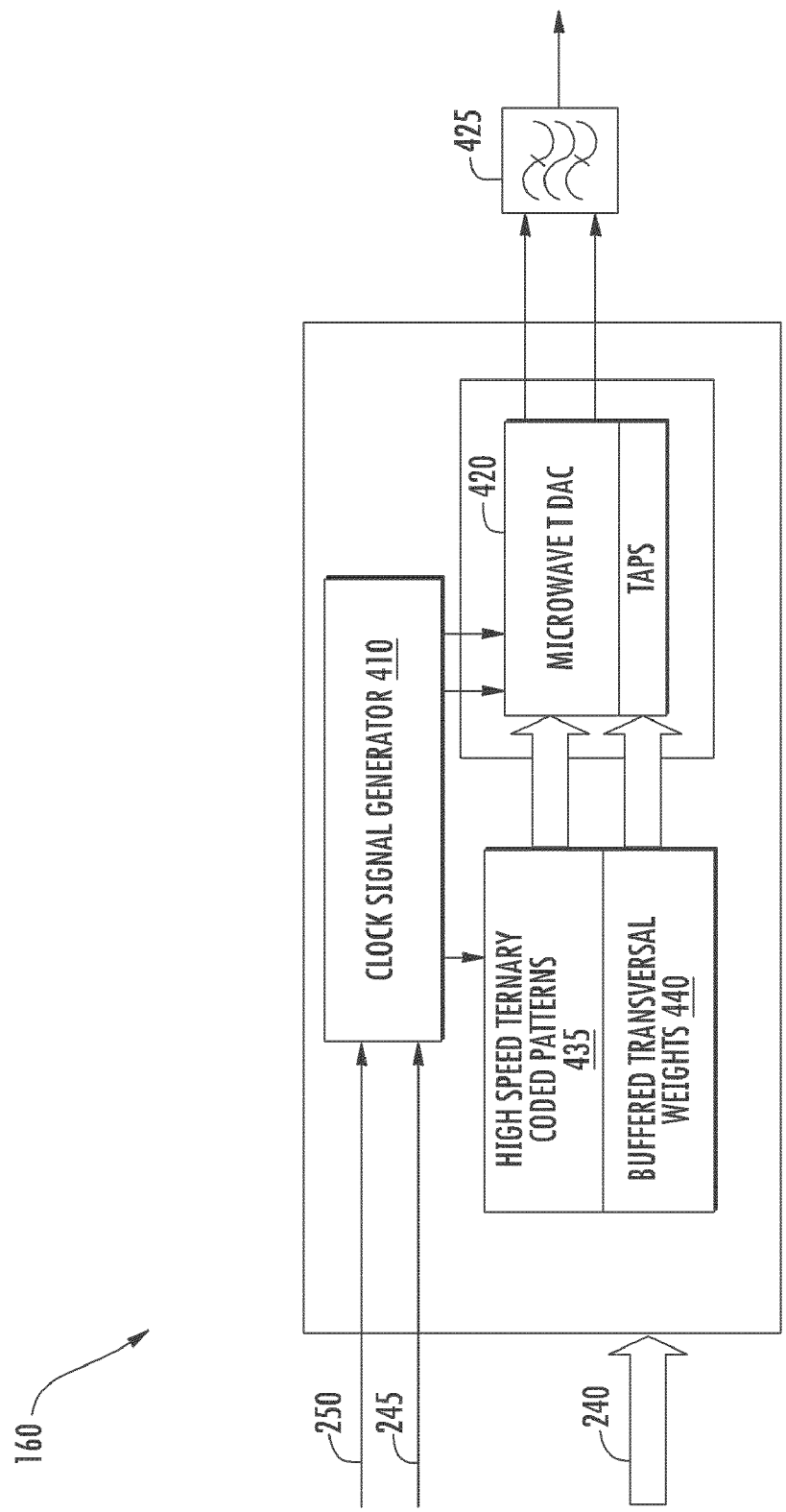
FIG. 4 is a more detailed block diagram that illustrates a transversal agile local oscillator synthesizer in accordance with an embodiment of the disclosure.

FIG. 4 is a more detailed block diagram that illustrates a transversal agile local oscillator synthesizer 160 in accordance with an embodiment of the disclosure. In this example, a transversal agile local oscillator synthesizer 160 is monolithically integrated using a low noise, high frequency silicon-germanium/complementary metal-oxide-semiconductor (SiGe/CMOS) process, which provides high noise performance and low power consumption. The SiGe/CMOS process also enables incorporation of a clock signal generator 410 and an on-board memory 440 that includes a code pattern generator 435, and weighting unit 415 for on-chip weighting, and storage of weights and patterns, as well as clock generation using a single chip local oscillator (LO) synthesizer (not shown) with low speed control word 240. Embodiments of the transversal agile local oscillator synthesizer 160 are shown and described in connection to FIGS. 8A-B and 9A-B.

The clock signal generator 410 receives and generates clock signals based on the reference clock 250 and Umod data 245 from the signal generator unit 305 (FIG. 3). The control word 240 is used to select a specific code pattern and associated weighting from memory (not shown) that is then used by a transversal digital-to-analog conversion (T-DAC) unit 420 to generate an extremely low phase noise, low spurious continuous wave (CW) LO frequency. The T-DAC unit 420 is further described in U.S. Pat. No. 7,504,976, which is incorporated by reference entirely herein.

The code pattern generator 435 generates digital pattern data that includes a spectrum of a single ternary pattern that contains a desired fundamental frequency, as well as spurious separated from the desired output by integer multiples of the step frequency. In general, spurious is considered any undesired frequency that is received or manufactured that can interfere with a wireless receiver operation. The spectrum of the ternary pattern can be moved to a higher frequency Nyquist zone, if required, through use of a Umod clocking function of the T-DAC unit 420. Below is Table 3 with exemplary instantiations of this functionality.

TABLE 3

|  | Example 1 | Example 2 | Example 3 |
| --- | --- | --- | --- |
| Ternary Pattern Rate | 1600 MSPS | 1600 MSPS | 2560 MSPS |
| LO Coverage BW | 1000 MHz | 800 MHz | 1280 MHz |
| Number of Taps | 16 | 64 | 128 |
| Frequency Step Size | 125 MHz | 12.5 MHz | 20 MHz |
| Umod Frequency | 3200 MHz | 4800 MHz | 10240 MHz |
| Output Frequency Range | 2700-3700 MHz | 4400-5200 MHz | 9600-10880 MHz |

Figure 5:
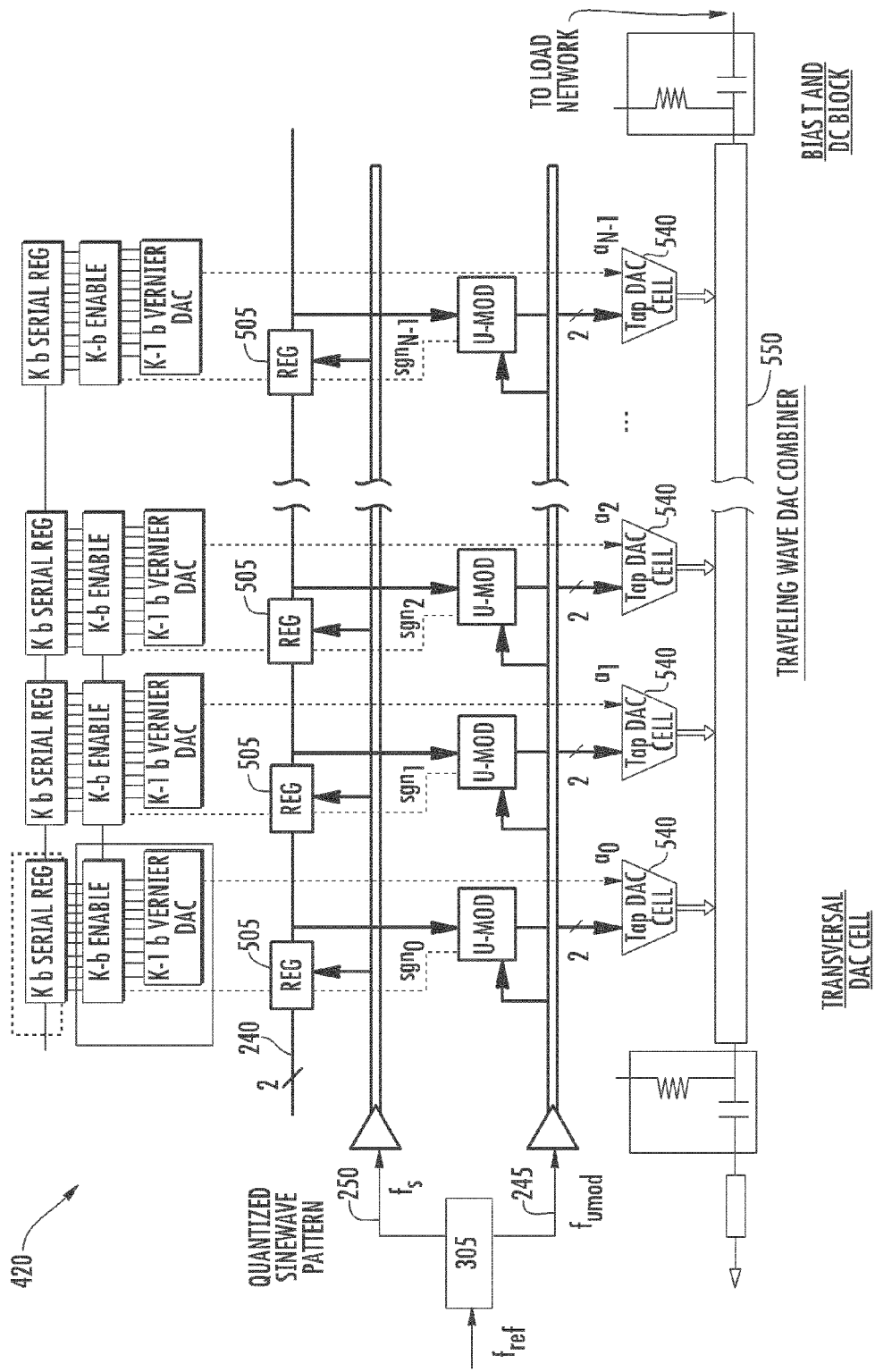
FIG. 5 is a block diagram that illustrates a transversal digital-to-analog (DAC) unit in accordance with an embodiment of the disclosure.

FIG. 5 is an exemplary T-DAC unit 420. The input of the T-DAC 420 receives, for example, high speed ternary coded patterns from the code pattern generator 435 (FIG. 4). A plurality of tap digital-to-analog conversion (DAC) cells 540 are electrically coupled to the plurality of registers 505 for converting the corresponding tapped digital signal into a current, thereby generating a set of currents. The weighting unit 415 (FIG. 4) produces sign and amplitude weight to the plurality of tap DAC cells 540. The ternary patterns from each tap digital-to-analog conversion (DAC) cell are weighted and summed in a traveling wave structure 550, attenuating the pattern spurious via a Sine filter that is forgiving in nature because attenuation can be achieved at integer multiples of the frequency step. An exemplary set of DAC weights and associated filtering responses is shown and described in connection with FIGS. 6 and 7.

Figure 6:
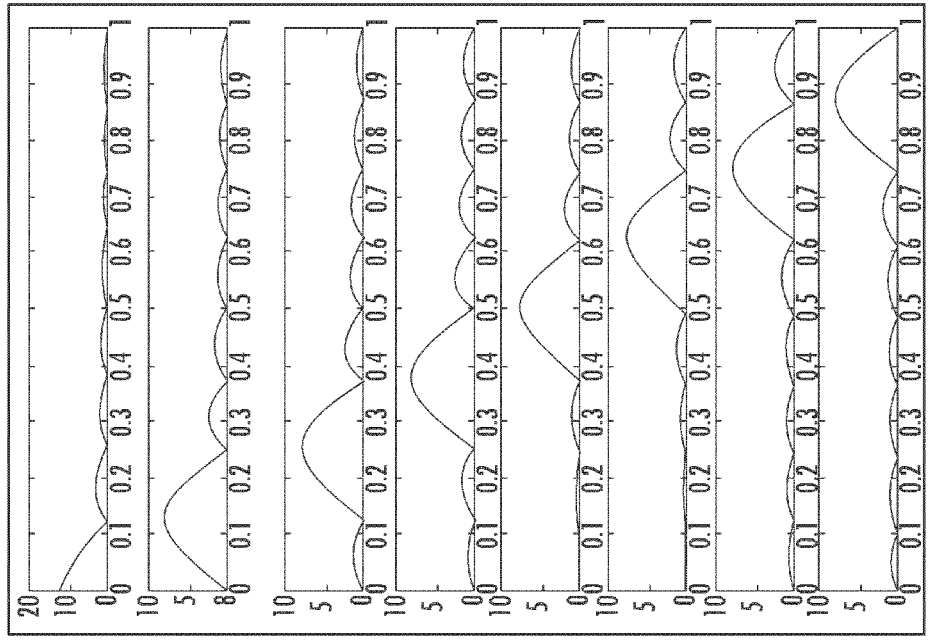
FIGS. 6 and 7 are charts that illustrate a set of digital-to-analog converter (DAC) weights and their associated filtering responses for a sixteen (16) tap example with eight (8) frequency steps across a Nyquist band.
Figure 7:
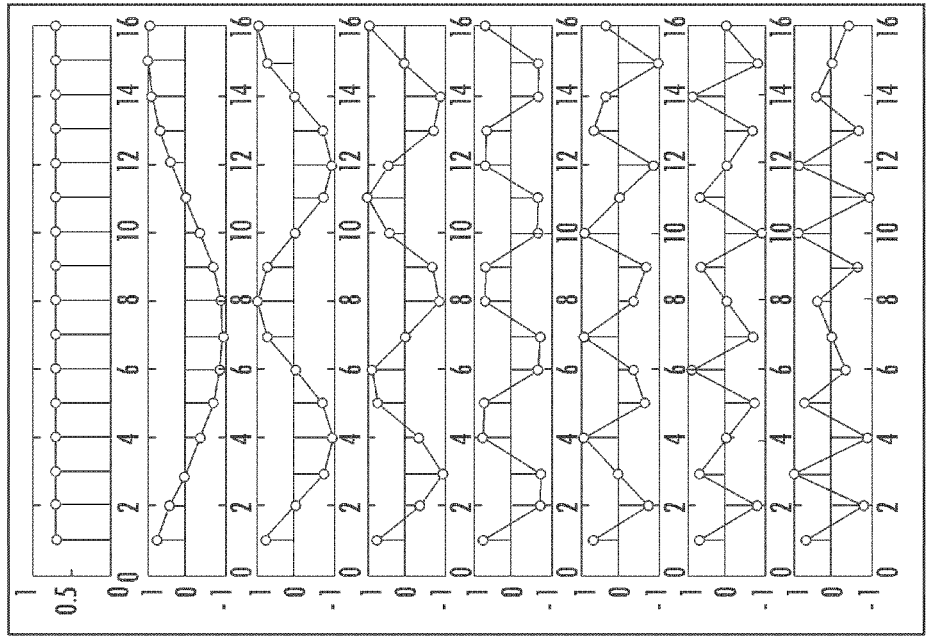

FIGS. 6 and 7 are charts that illustrate a set of digital-to-analog converter (DAC) weights and their associated filtering responses for a sixteen (16) tap example with eight (8) frequency steps across a Nyquist band. This example has filter nulls centered at spurious points. The pattern spurious is shown to be attenuated perfectly by the filter zeros, where the zeros precision is affected by combfilter coefficient tolerance where a level of approximately −80 dBc or more is sought, which can support certain Electromagnetic interference (EMI) requirements for centralized high performance systems. The worst case spurious from the individual ternary pattern may reach as high as −10 dBc, prior to the comb filter and a tolerance limiting attenuation by −60 dB will result in approximately 70 dB of attenuation from the overall design at a few specific frequency points.

The frequency range supported by the transversal agile local oscillator synthesizer 160 are a function of shift register data rate, as well as clock rate. The clock signal 815 from the clock signal generator 410 is distributed to the shift registers 505 and Umod array 525 (FIG. 5). The shift registers 505 can include ternary shift registers. Simulations in the SiGe/CMOS process without layout effects indicate shift register speeds of 30 gigasamples per second (GSPS), so a conservative estimate of 20 GSPS for the shift registers 505 can support a range of LO frequencies approaching 10 GHz directly. The Umod array 524 provides a sign weighted tap signal, where the weighting represents a static sign adjustment unique to each of the tap DAC cell in the array of tap DAC cells 540. The Umod array 524 further provides a modulation function for production of higher order Nyquist bands. The shift registers 505, Umod array 525 and tap DAC cells 540 are further described in connection with FIGS. 8 and 9.

The traveling wave distribution of the ternary shift register clock and Umod signals from the shift registers 505 and Umod array 525 (FIG. 5) has been measured to be highly accurate in the pseudomorphic high electron mobility transistor (pHEMT) based power TDAC design. Simulations of the traveling wave distribution in the SiGe/CMOS process have shown that 40-50 GSPS clock distribution is reasonably feasible, supporting the 20-30 GHz shift register data rates, as well as Umod translation to higher frequency sNyquist zones limited to the same frequency range. Therefore, synthesis of LO signals over 20-30 GHz is enabled.

Figure 8A:
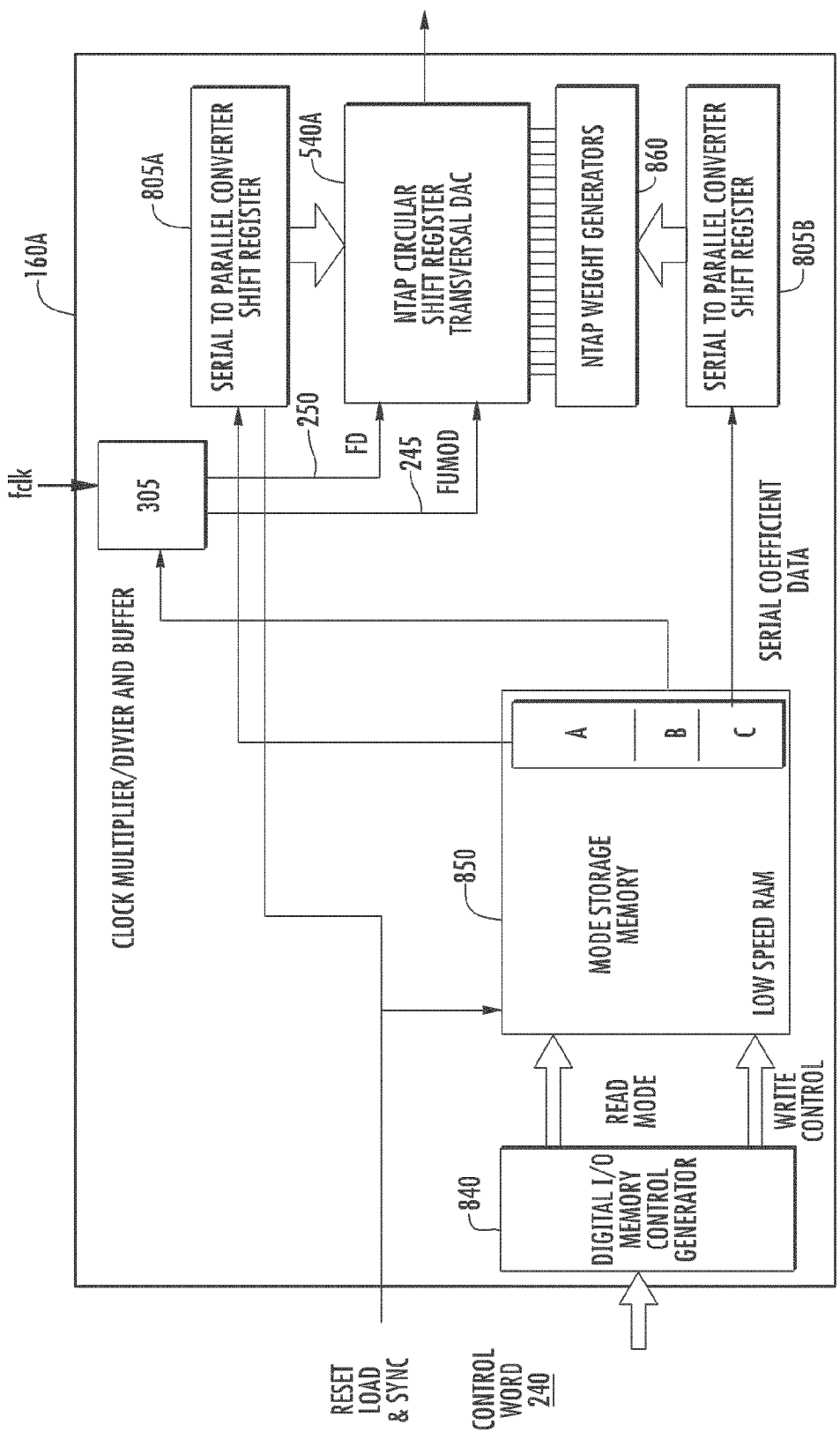
FIG. 8A is a block diagram that illustrates a circular shift register transversal local oscillator synthesizer 160A in accordance with an embodiment of the disclosure.

FIG. 8A is a block diagram that illustrates a circular shift register transversal local oscillator synthesizer 160A in accordance with an embodiment of the disclosure. The circular shift register transversal local oscillator synthesizer 160A includes a digital input/output memory control generator 840 that receives the control word 240 and produces signals related to read mode and write to a mode storage memory 850 (e.g., low speed RAM). Based on the signals from the digital input/output memory control generator 840, the mode storage memory 850 sends signals A, B, C.

Signal A is related to quantized sinewave, pattern sequence and pattern length word; signal B is related to clock state and multiplication state; and signal C is related comb filter coefficients. Signal A is inputted into serial to parallel converter shift registers 805A, which determines an activated portion of circular register and the number of patterns and cyclic interval on the activated portion of circular register. Signal B is inputted into the signal generator unit 305 that generates reference clock 250 and Umod data 245 based on signal B and send the clock 250 and Umod data 245 to an Ntap circular shift register transversal DAC 540A. Signal C is inputted into serial to parallel converter shift registers 805A, which determines a transversal filter weight that includes signal and amplitude components of DAC implement weight. The transversal filter weight is inputted into Ntap weight generators 860.

Figure 8B:
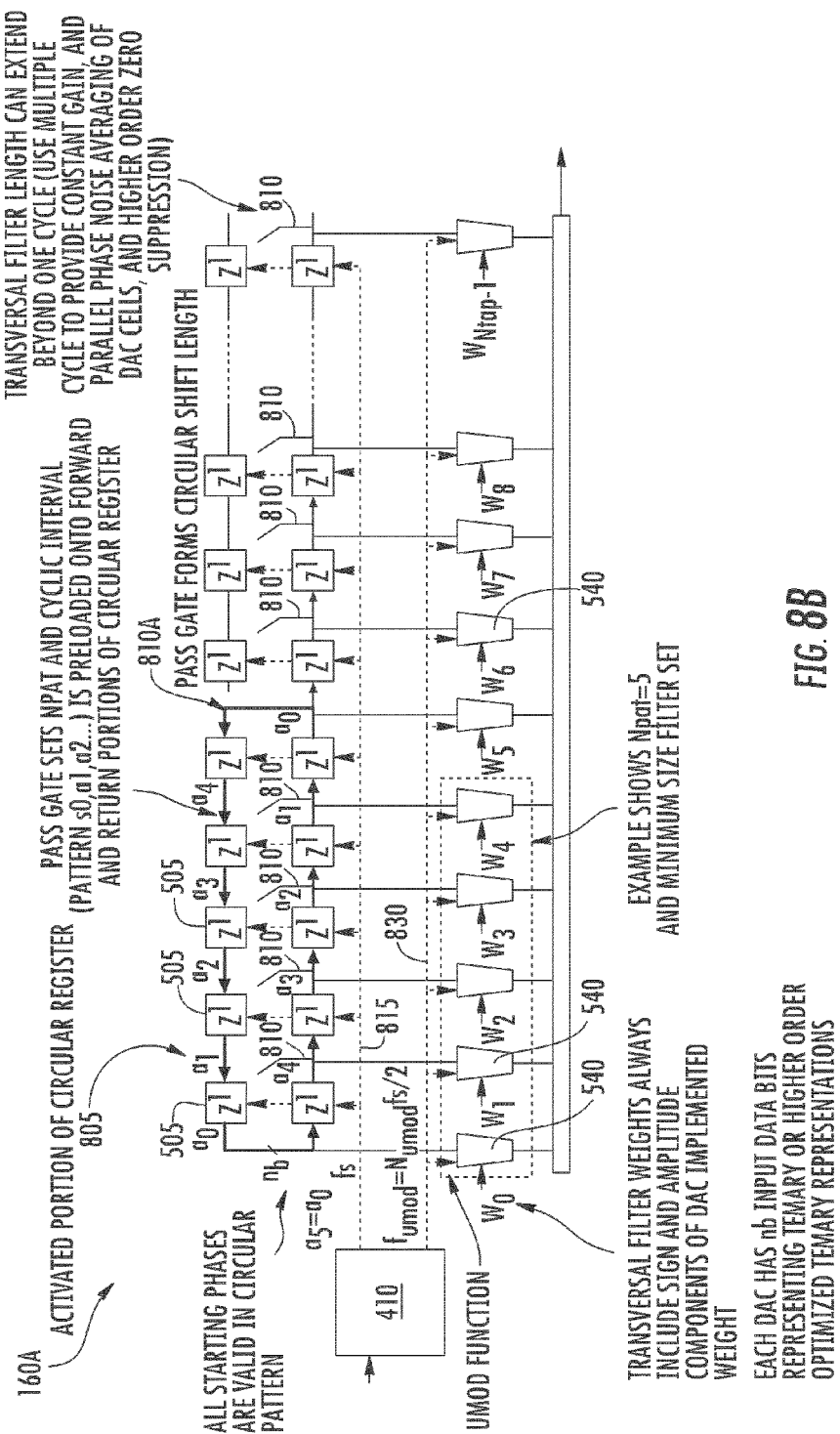
FIG. 8B is a more detailed block diagram that illustrates a circular shift register transversal local oscillator synthesizer in accordance with an embodiment of the disclosure.

FIG. 8B is a more detailed block diagram that illustrates a circular shift register transversal local oscillator synthesizer 160A in accordance with an embodiment of the disclosure. A plurality of shift registers 505 are coupled to the code pattern generator 435, producing a ternary pattern that includes a desired fundamental frequency. The clock signal generator 410 sends the clock signal 815 and a Umod clock signal 830 to the plurality of shift registers 505 and the tap DAC cells 540, respectively.

The plurality of shift registers 505 are arranged in parallel and each parallel register is coupled with a pass gate 810 that, when switched on by the code pattern generator 435, electrically couples the parallel register together, forming a circular register 805. In this example, the circular register 805 is formed by switching on pass gate 810A. The pass gate 810A determines a programmable circular shift length (e.g., 5) of the circular register 805. The pass gate 810 sets a number of patterns (e.g., 5) for the programmed cyclic interval (e.g. pattern a0, a1, a2, etc.) is preloaded onto forward or return or both portions of the circular register 805. The transversal filter length can extend beyond one cycle by using multiple cycles to provide constant gain, and parallel phase nose averaging of the tap DAC cells 540, and higher order zero suppression.

The ternary patterns are suppressed to low levels such as through comb filtering, using the circular register 805. The comb filter is formed by a transversal delay line with a circular return path, and tap DAC cells 540 connected to each of the transversal delay taps. Each tap DAC cell 540 also contains modulation logic that takes a signal related as a multiple of half the shift register clock frequency to provide internal higher order Nyquist emphasis. Each tap DAC cell 540 also implements a sign and amplitude weight in accordance with the transversal DAC architecture which can include more than one-bit (1-b) per tap DAC cell and preferably a 3 level or ternary DAC cell. The array of Digital-to-Analog converters (DACs) in the forward path are combined by traveling wave techniques to enable wide bandwidth. The clock distribution is also laid out in a traveling wave fashion as to cancel the delays in the traveling wave DAC line. The method of FIG. 8B is amenable to high frequency circular shift register design but requires the array of pass gates 810 to allow the redirection of high speed data to form arbitrary length circular pattern arrays required.

Figure 9A:
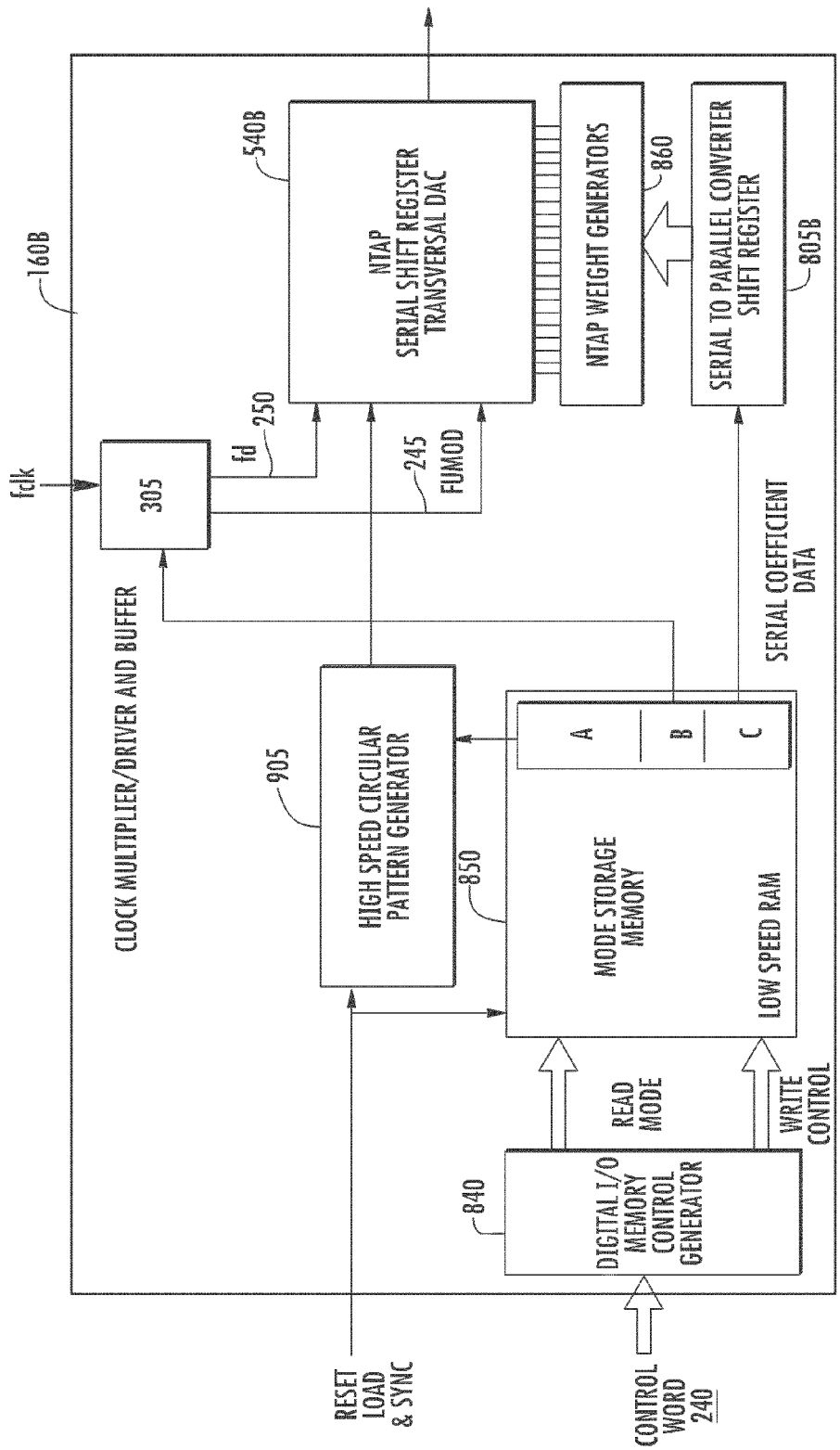
FIG. 9A is a block diagram that illustrates a multiplexed memory-read transversal local oscillator synthesizer in accordance with an embodiment of the disclosure.

FIG. 9A is a block diagram that illustrates a multiplexed memory-read transversal local oscillator synthesizer 160B in accordance with an embodiment of the disclosure. The synthesizer 160B has a similar architecture as the synthesizer 160A in FIG. 8A and thus, like features are labeled with the same reference numbers, such as the signal generator unit 305, digital input/output memory control generator 840, mode storage memory 850, Ntap weight generators 860, and serial to parallel converter shift registers 805A. However, the multiplexed memory-read transversal local oscillator synthesizer 160B further includes a high speed circular pattern generator 905 and an Ntap shift register transversal DAC 540B. The high speed circular pattern generator 905 instructs the Ntap shift register transversal DAC 540B circular patterns on its registers by way of a high speed parallel loaded high speed shift register or other high speed memory device that is preloaded with addressable features, software as proposed in the designs of circular shift register transversal local oscillator synthesizer 160A, such as that shown in FIGS. 8A-B. This method will require a parallel load to occur within a single clock cycle to enable arbitrary length circular patterns. This is easier to construct but less amenable to high speed operation due to more critical timing.

Figure 9B:
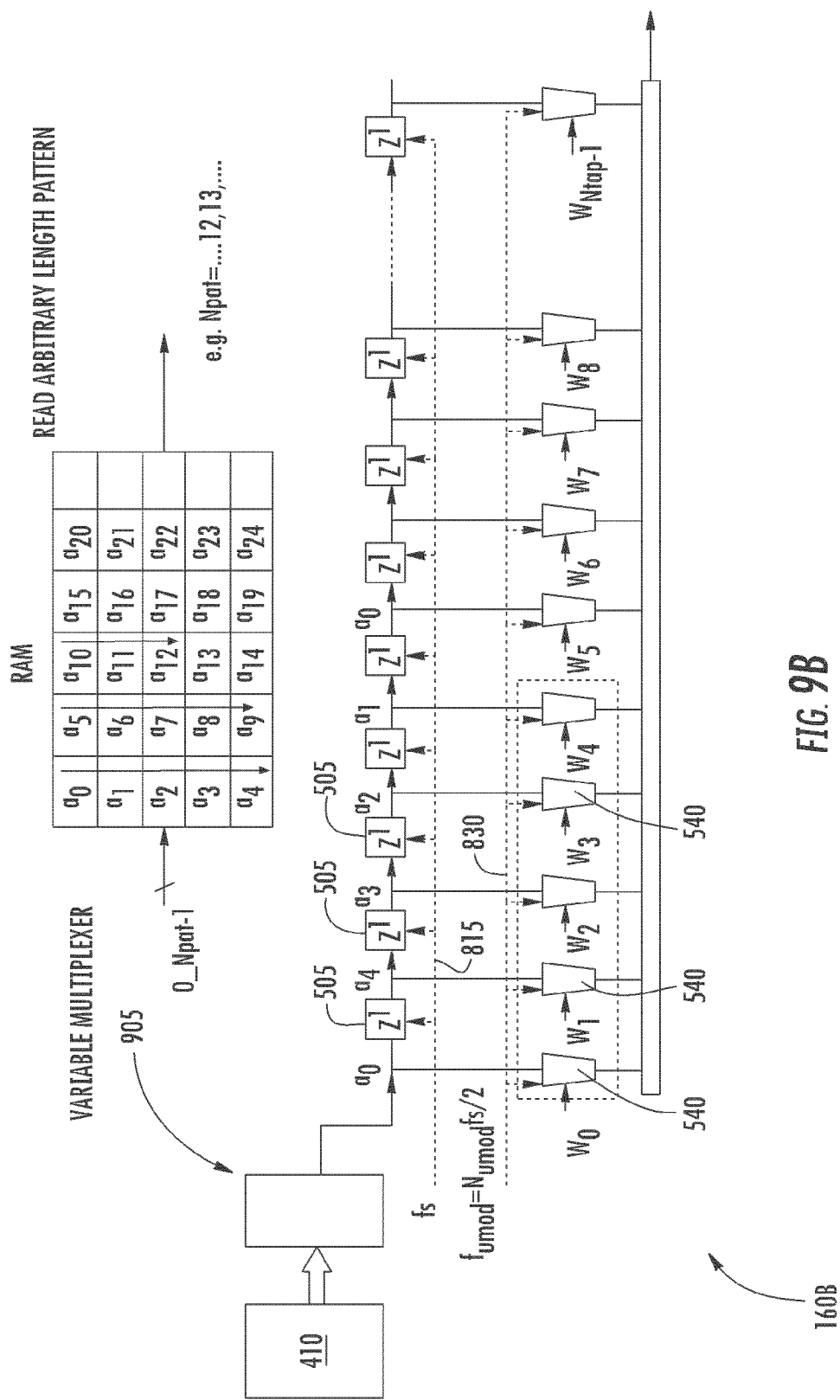
FIG. 9B is a more detailed block diagram that illustrates a multiplexed memory-read transversal local oscillator synthesizer in accordance with an embodiment of the disclosure.

FIG. 9B is a more detailed block diagram that illustrates a multiplexed memory-read transversal local oscillator synthesizer 160B in accordance with an embodiment of the disclosure. The synthesizer 160B is similar to the synthesizer 160A of FIG. 8B and like features are labeled with the same reference numbers, such as the shift registers 505 and tap DAC cells 540. However, the plurality of shift registers 505 are arranged in serial and receive an arbitrary length pattern from the code pattern generator 435 via a variable multiplexer 905.

The multiplexed memory-read transversal local oscillator synthesizer 160B uses a short cyclic pattern that can be stored on memory 440 and that produces the desired LO term and known spurious at multiples of a fundamental step frequency set by the clock rate. The tap DAC cells 540 are programmed to implement a comb filter which nulls each of the undesired terms, which undesired terms result from 3-b quantization of the digital LO pattern. The output spectrum can contain a few spurious, and the spurious are suppressed by the comb filter to the level enabled by tolerance (about −80 dBc is desired). Due to the parallelism of the comb filter, a 10 log 10(N) advantage in the phase noise contribution of the inventions, where N=number of taps, is enabled relative to the fundamental phase noise of each DAC. A return path shift register, where a bypass at each tap is enabled, allows programming of a 2N sequency to a N tap filter. A monolithic integrated circuit solution is desired where many of these simple patterns are local stored on chip. This solution can use a SiGe implementation.

Figure 10:
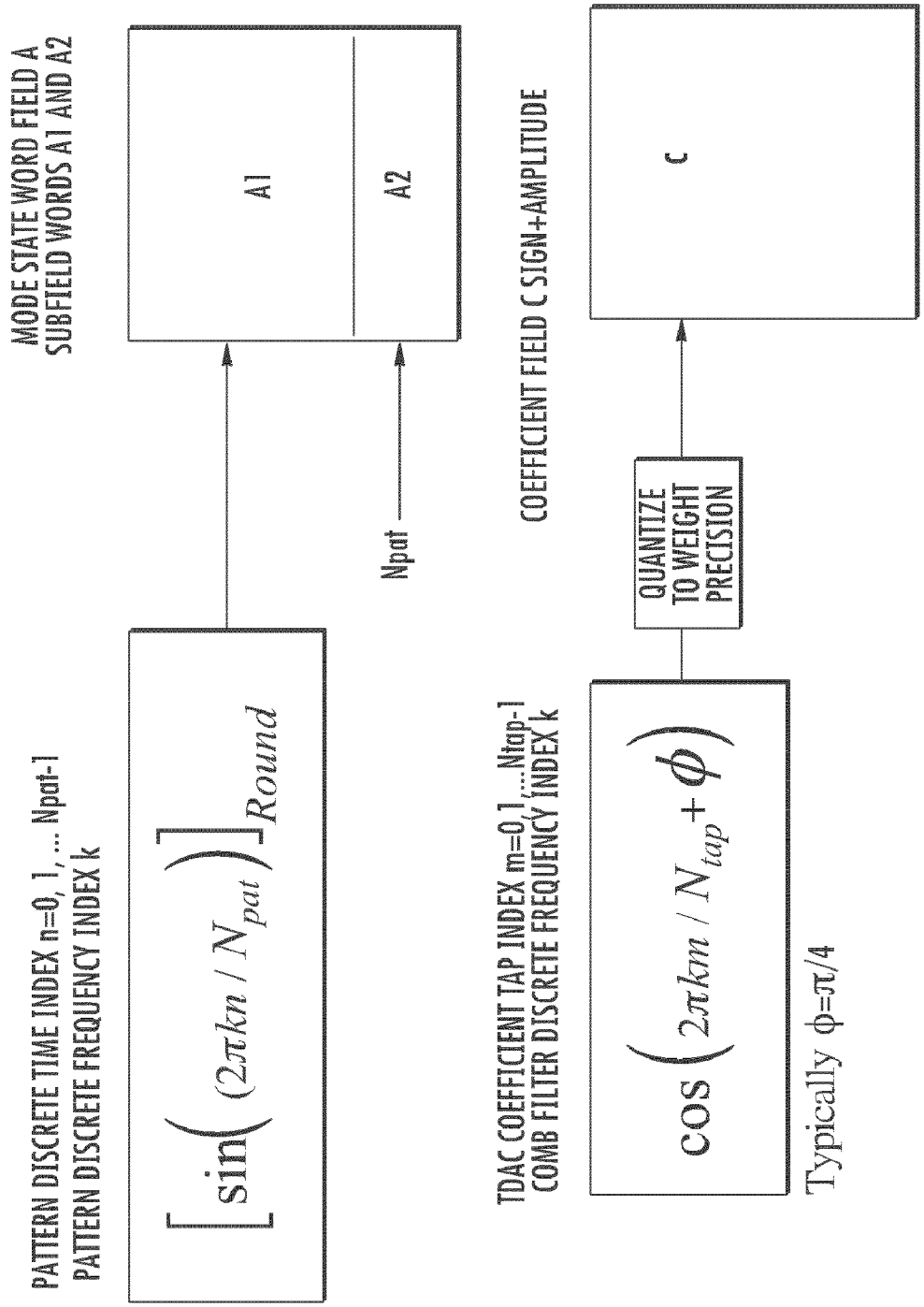
FIG. 10 shows methods of determining signals A and C stored at mode storage memory in accordance with an embodiment of the disclosure.

FIG. 10 shows methods of determining signals A and C stored at mode storage memory 850. Signal A includes subfield word A1 that is determined based on pattern discreet time and frequency index, and subfield word A2 that is determined based on the number of patterns. Signal C can be determined based on TDAC coefficient tap index and comb filter discrete frequency index, both of which are quantized to weight precision.

Figure 11:
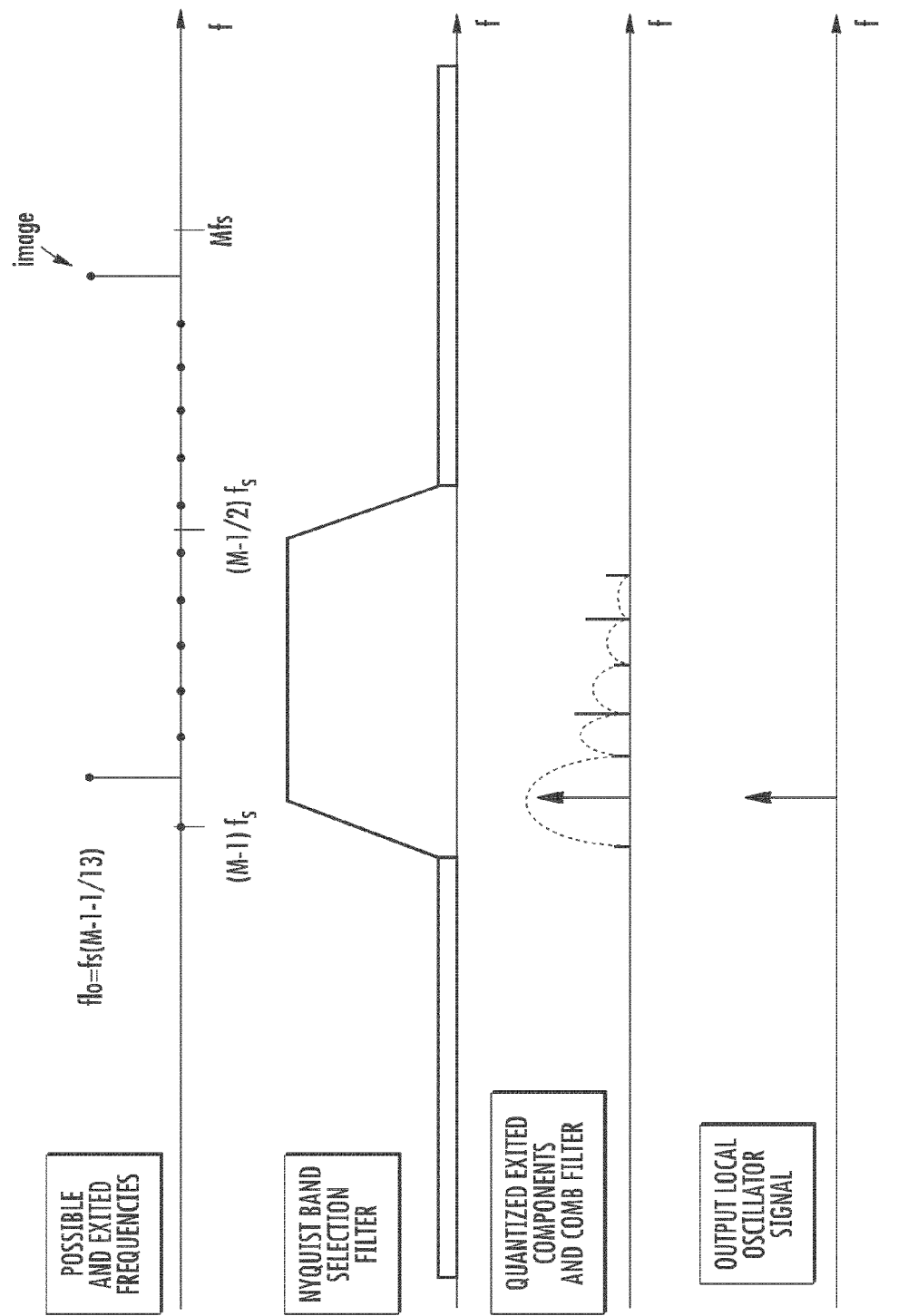
FIG. 11 shows a frequency selection process by a transversal local oscillator synthesizer in accordance with an embodiment of the disclosure.

FIG. 11 shows a frequency selection process by a transversal local oscillator synthesizer, which generates possible and excited frequencies. A Nyquist band selection filter passes signals from a range of frequencies. The filtered signals are quantized and excited by excited components and comb filters. A quantized and excited signal is selected and outputted as a local oscillator signal.

Figure 12:
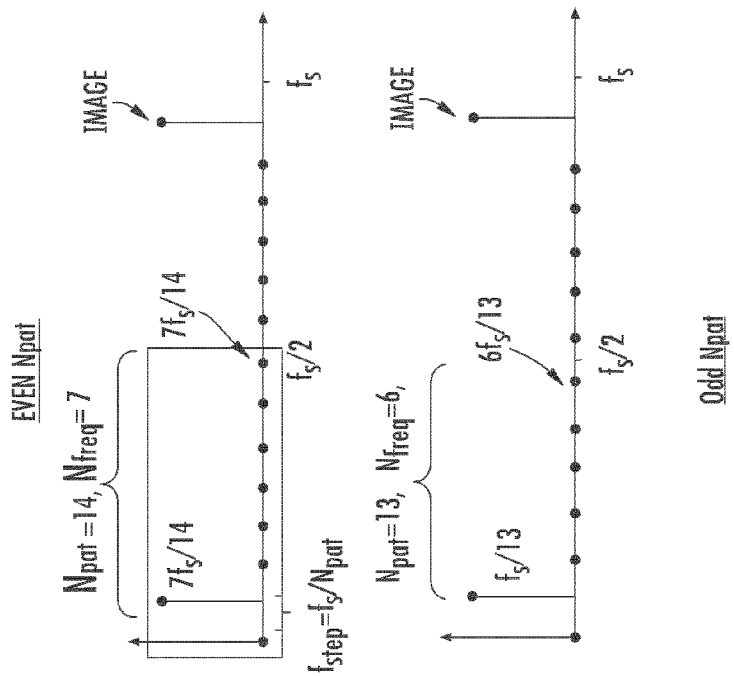
FIG. 12 shows equations for a Umod frequency, a frequency step, and an output frequency of a transversal local oscillator synthesizer.

FIG. 12 shows equations for a Umod frequency, a frequency step, and an output frequency of a transversal local oscillator synthesizer. The equations show relationships between the output frequencies and other variable shown in FIG. 12

The synthesizers described above provide a superior approach to the generation of LO signals over traditional synthesizers because the disclosed synthesizers afford smaller size benefits of a monolithic Direct Digital DAC technique without the drawback of performance issues of many spurious terms and degraded phase noise. The 3-b quantization and patterns result in very well controlled intentional spurious signals where filter nulls are planned, and no uncontrolled spurious arise outside these nulls. It is also superior to direct synthesis because its integrated filtering provides a significant reduction or elimination of required additional components. In the absence of the disclosed synthesizers, a direct synthesis apparatus may include multiple oscillators, synthesizers and mixers, that result in both size and performance degradation. The disclosed synthesizers provides a direct path, thereby avoiding the contribution from multiple components.

A benefit of the disclosed synthesizers is the ability of the comb filter output to exhibit low phase noise due to parallelism in the device. A 10 log 10(N) advantage for N taps employed in the filter, combined with SiGe technology, which is known for low phase noise, can enable lower noise than one individual DAC. An advanced simulation of the device shows that the limit to phase noise is the clock driver. A high edge slope clock driver was designed in the SiGe/120 Jazz process and showed a 4 GHz clock with −170 dBc/Hz at 100 KHz offset and −155 dBc/Hz at 1 KHz offset. This is superior by a significant margin over any synthesizer available today.

The disclosed synthesizers may include, without limitation, at least one of the following features:
- Better than state of the art Phase Noise due to the low phase noise TDAC distributed architecture and SiGe Heterojunction Bipolar Transistor (HBT) process
- Frequency Stepped Coverage from 0-30 GHz and efficient implementations or covering operational band such as UHF, L, S X, Ku bands and even higher frequency bands.
- Orders of magnitude improvement in size and cost via single chip design and low cost commercial microwave packaging replacing modules and racks of equipment
- Simple low speed Digital I/O control
- Starting phase synchronization, enabling phase repeatability across multiple units and from dwell to dwell.

This description has been presented for purposes of illustration and description. It is not intended to be exhaustive or to limit the disclosure to the precise forms disclosed. Obvious modifications or variations are possible in light of the above teachings. The embodiments discussed, however, were chosen to illustrate the principles of the disclosure, and its practical application. The disclosure is thus intended to enable one of ordinary skill in the art to use the disclosure, in various embodiments and with various modifications, as are suited to the particular use contemplated. All such modifications and variation are within the scope of this disclosure, as determined by the appended claims when interpreted in accordance with the breadth to which they are fairly and legally entitled.

Therefore, having thus described the disclosure, at least the following is claimed:

1. An integrated circuit comprising:
   a clock signal generator that generates a clock signal;
   a code pattern generator that generates digital pattern data based on the clock signal; and
   a transversal digital-to-analog conversion (T-DAC) unit including a plurality of registers and a unary modulator (Umod) array, the T-DAC providing frequency selection ranges covering wide operational bands based on the digital pattern data and the clock signal.

2. The integrated circuit of claim 1, wherein the plurality of registers are coupled to the code pattern generator, producing a ternary pattern that includes a desired fundamental frequency.

3. The integrated circuit of claim 2, wherein the plurality of registers are arranged in parallel and each parallel register are coupled with a pass gate that, when switched on, electrically couples the parallel register forming a circular register.

4. The integrated circuit of claim 3, wherein the pass gate is switched on by the code pattern generator.

5. The integrated circuit of claim 2, wherein the plurality of registers are arranged in serial and receive an arbitrary length pattern from the code pattern generator.

6. The integrated circuit of claim 2, wherein the Umod array is configured to move a spectrum of the ternary pattern to a higher frequency Nyquist zone.

7. The integrated circuit of claim 2, further comprising a plurality of tap digital-to-analog conversion (DAC) cells that are electrically coupled to the plurality of registers for converting corresponding tapped digital signals into a current, thereby generating a set of currents.

8. The integrated circuit of claim 7, further comprising a weighting unit that produces sign and amplitude weight to the plurality of tap DAC cells.

9. The integrated circuit of claim 8, further comprising a traveling wave structure that receives the ternary pattern from each tap DAC cell, wherein the ternary pattern are the weights and summed at the traveling wave structure.

10. A synthesizer comprising:
    a clock signal generator that generates a clock signal;
    memory including a code pattern generator that includes instructions for generating digital pattern data based on the clock signal; and
    a transversal digital-to-analog conversion (T-DAC) unit that receives the digital pattern data and the clock signal, the T-DAC unit providing frequency selection ranges covering wide operational bands based on the digital pattern data and the clock signal,
    wherein the clock signal generator, the T-DAC unit, and the memory are monolithically integrated together.

11. The synthesizer of claim 10, wherein the plurality of registers are coupled to the code pattern generator, producing a ternary pattern that includes a desired fundamental frequency.

12. The synthesizer of claim 11, wherein the plurality of registers are arranged in parallel and each parallel register are coupled with a pass gate that, when switched on, electrically couples the parallel register forming a circular register.

13. The synthesizer of claim 12, wherein the pass gate is switched on by the code pattern generator.

14. The synthesizer of claim 11, wherein the plurality of registers are arranged in serial and receive an arbitrary length pattern from the code pattern generator.

15. The synthesizer of claim 11, wherein the Umod array is configured to move a spectrum of the ternary pattern to a higher frequency Nyquist zone.

16. The synthesizer of claim 11, further comprising a plurality of tap digital-to-analog conversion (DAC) cells that are electrically coupled to the plurality of registers for converting corresponding tapped signals into a current, thereby generating a set of currents.

17. The synthesizer of claim 16, further comprising a weighting unit that produces sign and amplitude weight to the plurality of tap DAC cells.

18. The synthesizer of claim 17, further comprising a traveling wave structure that receives the ternary pattern from each tap DAC cell, wherein the ternary pattern are the weights and summed at the traveling wave structure.

19. A local oscillator subsystem comprising:
a signal generator unit that generates reference clock and Umod data;
a silicon-germanium (SiGe) Heterojunction Bipolar Transistor (HBT) transistor that is coupled to the signal generator unit, and processes the reference clock and Umod data; and
a local oscillator synthesizer is coupled to the SiGe HBT transistor and receives the processed reference clock and Umod data, the local oscillator synthesizer including:
a clock signal generator that generates a clock signal based on the reference clock;
a code pattern generator that generates digital pattern data based on the clock signal; and
a transversal digital-to-analog conversion (T-DAC) unit that receives the digital pattern data and the clock signal, the T-DAC unit providing frequency selection ranges covering wide operational bands based on the digital pattern data and the clock signal.

20. The local oscillator subsystem of claim 19, further comprising a pattern unit that provides a control word to the local oscillator synthesizer, which selects a frequency that the local oscillator synthesizer generates.

* * * * *